(12) United States Patent
Sadaka et al.

(10) Patent No.: US 7,544,548 B2
(45) Date of Patent: Jun. 9, 2009

(54) TRENCH LINER FOR DSO INTEGRATION

(75) Inventors: Mariam G. Sadaka, Austin, TX (US);
Ted R. White, Austin, TX (US);
Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 447 days.

(21) Appl. No.: 11/443,628

(22) Filed: May 31, 2006

(65) Prior Publication Data

US 2007/0281436 A1   Dec. 6, 2007

(51) Int. Cl.
*H01L 21/8238* (2006.01)
(52) U.S. Cl. .................. 438/154; 438/198; 438/222; 257/E21.642
(58) Field of Classification Search .......... 438/154, 438/198, 222, 226, 429; 257/E21.642
See application file for complete search history.

(56) References Cited

U.S. PATENT DOCUMENTS 6,815,278 B1 * 11/2004  Ieong et al. .............. 438/198
7,125,785 B2 * 10/2006  Cohen et al. ............. 438/481
2005/0090072 A1   4/2005  Doris et al. .............. 438/424
2005/0142799 A1   6/2005  Seo ........................ 438/424

OTHER PUBLICATIONS

M. Yang et al., "High Performance CMOS Fabricated on Hybrid Substrate with Different Crystal Orientations," IEEE, IEDM 2003, pp. 453-456.
B. Doris et al., A Simplified Hybrid Orientation Technology (SHOT) for High Performance CMOS, VLSI Technology, Digest of Technical Papers, 2004 Symposium, pp. 86-87.

* cited by examiner

*Primary Examiner*—Chandra Chaudhari
(74) *Attorney, Agent, or Firm*—Hamilton & Terrile, LLP; Michael Rocco Cannatti

(57) ABSTRACT

A semiconductor process and apparatus provide a shallow trench isolation region (96) with a trench liner (95, 104) for use in a hybrid substrate device (21) by lining a first trench with a first trench liner (95), and then lining a second trench formed within the first trench by depositing a second trench liner (104) that is anisotropically etched to expose an underlying substrate (70) on which is epitaxially grown a silicon layer (110) to fill the second trench. By forming first gate electrodes (251) over a first SOI substrate (90) using deposited (100) silicon and forming second gate electrodes (261) over an epitaxially grown (110) silicon substrate (110), a high performance CMOS device is obtained which includes high-k metal PMOS gate electrodes (261) having improved hole mobility.

22 Claims, 7 Drawing Sheets

TRENCH LINER FOR DSO INTEGRATION

BACKGROUND OF THE INVENTION

1. Field of the Invention

The present invention is directed in general to the field of semiconductor devices. In one aspect, the present invention relates to high-performance complementary metal oxide semiconductor (CMOS) field effect transistors (FETs) fabricated on hybrid or dual substrates.

2. Description of the Related Art

To address the difference in electron and hole mobility values for NMOS and PMOS transistor devices formed on semiconductor wafers having a single crystal orientation, CMOS devices are increasingly fabricated with hybrid substrates with different surface orientations using semiconductor-on-insulator (SOI) or bulk silicon wafer bonding to provide PMOS and NMOS devices with their own optimized crystal orientation. With hybrid devices, shallow trench isolation (STI) regions are formed to isolate the substrates, and typically include a liner oxide film that is deposited and/or grown in the etched substrate trenches and covered by a filling oxide prior to chemical mechanical planarization. In addition to curing damage caused by the substrate etch process and passivating the STI sidewalls, the liner oxide improves device reliability by ensuring proper corner rounding, and eliminates device leakage by preventing formation of divots that can lead to residual polysilicon formation. Prior approaches for fabricating hybrid devices have formed the dual NMOS and PMOS substrates before forming the STI regions using conventional liner techniques. However, when one of the substrate materials (e.g., the (110) silicon used to form the PMOS devices) has a higher oxidation rate than the other substrate material (e.g., the (100) silicon used to form the NMOS devices), the liner thickness will differ between the NMOS and PMOS devices. As a result, device reliability and STI passivation will differ between the NMOS and PMOS devices. On the other hand, if the STI regions are formed in the first substrate before the second substrate is etched and filled, the liner will be only be on one side of the STI regions (e.g., on the first substrate side) but not on the other side.

Accordingly, a need exists for a semiconductor manufacturing process which provides the process and performance advantages of forming a trench liner layer for the entire STI regions used with dual substrate devices. There is also a need for a fabrication process which avoids the process and performance limitations associated forming a trench liner after the dual substrates are formed. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
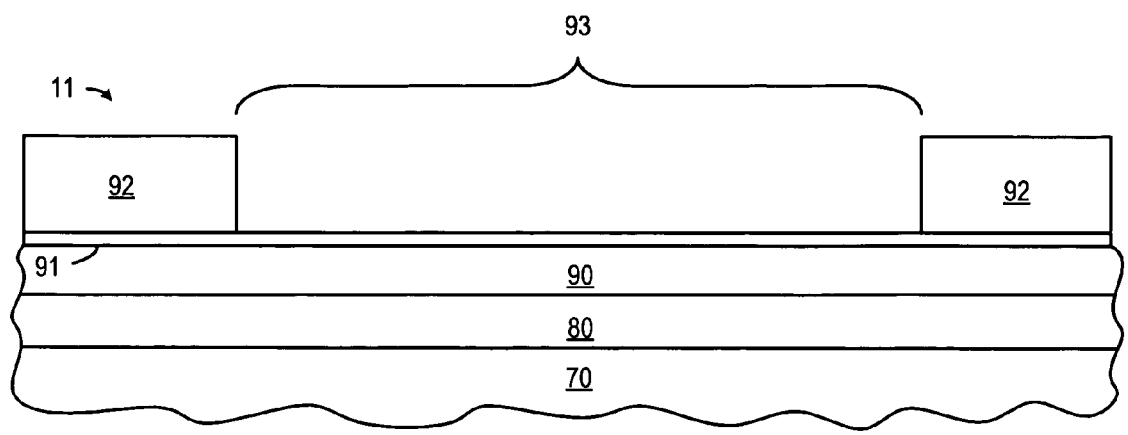
FIG. 1 is a partial cross-sectional view of a semiconductor wafer structure on which first oxide and nitride layers are formed over SOI layers and a semiconductor substrate.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate,

DETAILED DESCRIPTION

A method and apparatus are described for fabricating high performance CMOS devices with hybrid or dual substrates by forming shallow trench isolation regions in a first substrate that includes a trench liner on both sides prior to epitaxially growing the second substrate. Using a two-stage liner formation process, a first liner layer is deposited during formation of the STI region, and a second liner layer is deposited during formation of the second epitaxial substrate. With a trench liner formed on all sides of the STI region, Dual-Substrate Orientation (DSO) substrates can be fabricated which include liner benefits, such as STI sidewall passivation, etch damage cure, corner rounding and/or divot prevention. By forming the trench liner and STI regions prior to forming the second substrate, improved device reliability and STI passivation is obtained.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses may be used. Such details are well known and not considered necessary to teach one skilled in the art of how to make or use the present invention.

Turning now to FIG. 1, a partial cross-sectional view is illustrated of a semiconductor wafer structure 11 on which first oxide layer 91 and nitride layer 92 are formed over semiconductor-on-insulator (SOI) layers 80, 90 and a semiconductor substrate layer 70. Specifically, the structure 11 includes a first semiconductor layer 70 formed of a semiconductor material that has a first crystallographic orientation. Depending on the type of transistor device being fabricated, the first semiconductor layer 70 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group IV and/or III-V and/or II-VI compound semiconductors or any combination thereof, and may optionally be formed as the bulk handling wafer. The crystallographic orientation of the first semiconductor layer 70 may be (110), (111), or (100).

In the SOI layers, the structure 11 includes an insulator layer 80 formed on the first semiconductor layer 70, which will ultimately be used to form the buried oxide (BOX) layer for silicon-on-insulator devices. The thickness of the insulator layer 80 should be sufficiently thick to electrically isolate the first semiconductor layer 70 from the second semiconductor layer 90, and in a selected illustrative embodiment, is approximately between 1400-1500 Angstroms thick. In addition, the SOI layers include a second semiconductor layer 90 having a predetermined thickness (e.g., approximately between 500-800 Angstroms thick) and formed of a semiconductor material which has a second crystallographic orientation which is different from the first crystallographic orientation. Depending on the type of transistor device being fabricated, the second semiconductor layer 90 may be formed from any semiconductor material, including, for example, Si, SiC, SiGe, SiGeC, Ge, GaAs, InAs, InP as well as other group IV or III-V or II-VI compound semiconductors or any combination thereof. The crystallographic orientation of the second semiconductor layer 90 may be (100), (111), or (110). The crystallographic orientation of the second semiconductor layer 90 may differ from or may be the same as the crystallographic orientation of the first semiconductor layer 70. The crystal orientations of the first semiconductor layer 70 and the second semiconductor layer 90 will depend on the materials used to form the wafer structure 11. For example, when silicon is employed as the semiconductor material, electron mobility is higher on a (100) surface orientation, and hole mobility is higher on a (110) surface orientation. In this case, the (100) silicon surface is used as the substrate layer for NMOS devices, while the (110) silicon surface is used as the substrate layer for PMOS devices.

After formation of the SOI layers 80, 90, an oxide layer 91 is formed on the second semiconductor layer 90, such as by growing or depositing an oxide layer, such as a pad oxide layer. Next, a nitride layer 92 is deposited. To account for subsequent photolithography, etch, and chemical mechanical polishing (CMP) processing and allow for overgrowth of the epitaxial layer (described hereinbelow), the nitride layer 92 should have a predetermined minimum thickness (e.g., approximately between 900-1300 Angstroms thick), though other minimum thicknesses may be used. Once the nitride layer 92 is patterned and etched, a mask is formed to expose a portion 93 of the oxide layer 91.

Figure 2:
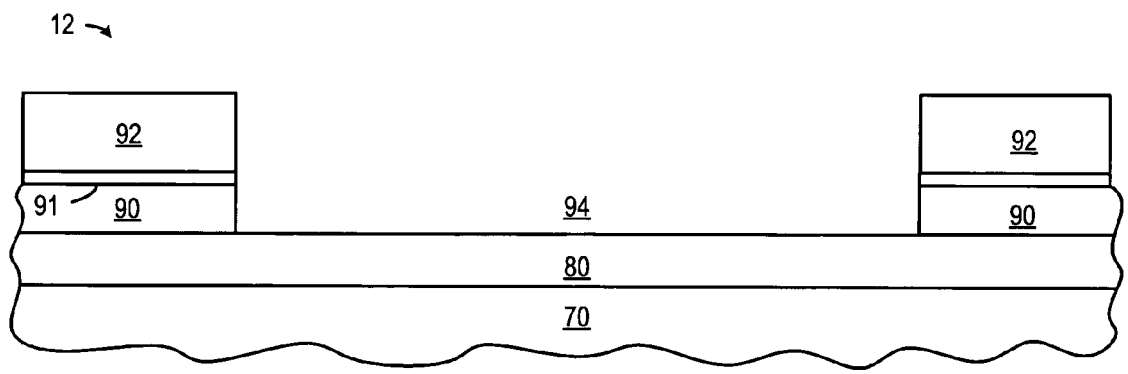
FIG. 2 illustrates processing subsequent to FIG. 1 where portions of the first oxide layer and an SOI semiconductor layer have been removed to form a shallow trench.

FIG. 2 illustrates processing of a semiconductor wafer structure 12 subsequent to FIG. 1 where portions of the first oxide layer 91 and an SOI semiconductor layer 90 have been removed to form a shallow trench 94. In particular, after forming the nitride mask 92, any desired patterning and anisotropic etching techniques may be used to remove a portion of the second semiconductor layer 90, thereby forming an opening 94 to expose a portion of the insulator layer 80. As described below, the shallow trench regions and second or epi substrate regions are formed at least in part in the opening 94.

Figure 3:
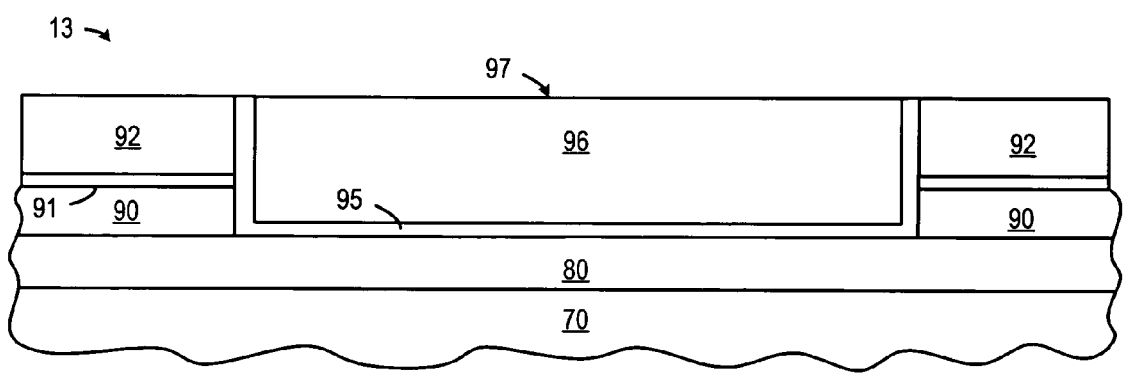
FIG. 3 illustrates processing subsequent to FIG. 2 after a first trench liner layer and deposited oxide layer are formed in a shallow trench and planarized to form a shallow trench region.

FIG. 3 illustrates processing of a semiconductor wafer structure 13 subsequent to FIG. 2 after a first trench liner layer 95 and deposited dielectric layer 96 are formed in the shallow trench and planarized to form a shallow trench region 97. In particular, the first trench liner layer 95 may be deposited and/or grown as a conformal oxide and/or nitride layer(s) in at least the opening 94 to a thickness of approximately between 10-200 Angstroms, though other dielectric materials and thicknesses could be used. After depositing the first trench liner layer 95, an oxide layer 96 is deposited and then polished back to level with the mask layer 92 (as shown in FIG. 3) or back to the level of the second semiconductor layer 90 (not shown). While the deposited dielectric layer 96 may be formed with any desired dielectric material, a high density plasma oxide is deposited in accordance with a selected embodiment. With such a sequence, the first trench liner 95 remains on the vertical sidewalls and bottom of the shallow trench region 97.

Figure 4:
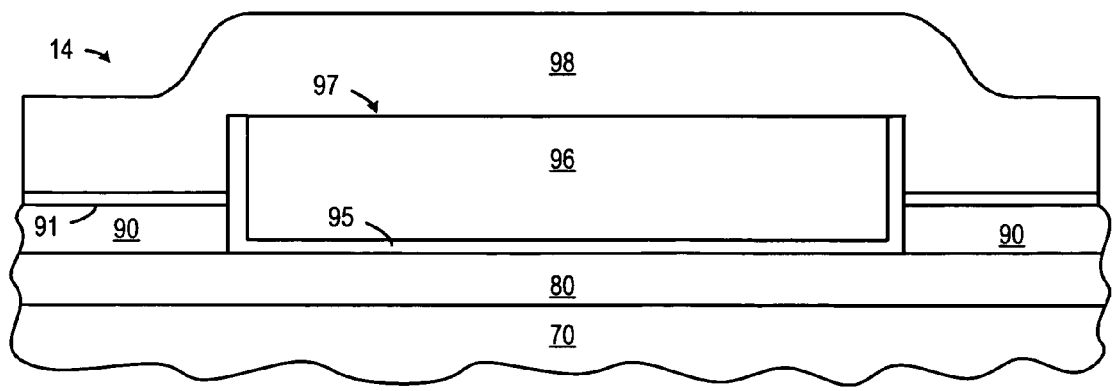
FIG. 4 illustrates processing subsequent to FIG. 3 after a second nitride layer is formed over at least the shallow trench region.

FIG. 4 illustrates processing of a semiconductor wafer structure 14 subsequent to FIG. 3 after the nitride layer 92 was removed, and a nitride layer 98 is formed over at least the shallow trench region 97. In a selected illustrative embodiment, the nitride layer 98 is sufficiently thick to serve as an n-well implant block during subsequent processing and/or to serve as a CMP stop layer. For example, in a selected embodiment, the thickness of the nitride layer 98 is approximately between 800-1100 Angstroms thick, though other thicknesses can be used. As illustrated, the nitride layer 98 may be formed by stripping the first nitride layer 92 and depositing a new nitride layer 98, or by forming additional nitride on top of the first nitride layer 92.

Figure 5:
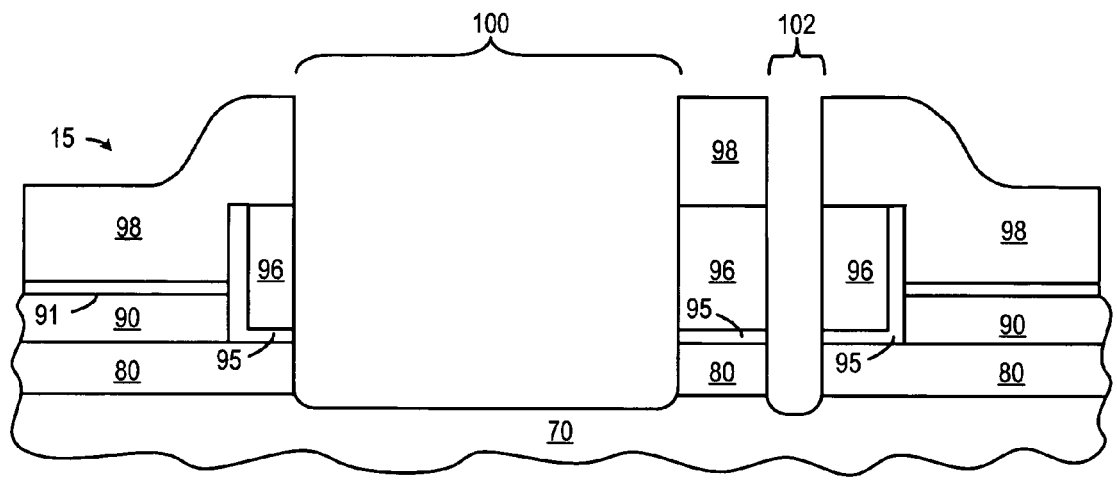
FIG. 5 illustrates processing subsequent to FIG. 4 after portions of the second nitride layer, deposited oxide layer, first trench liner layer and buried oxide layer have been removed to form one or more openings to the semiconductor substrate.

FIG. 5 illustrates processing of a semiconductor wafer structure 15 subsequent to FIG. 4 after portions of the nitride layer 98, deposited oxide layer 96, first trench liner layer 97 and buried oxide layer 80 have been removed to form one or more openings 100, 102 to the semiconductor substrate 70. In particular, pattern transfer and etching of the mask nitride layer 98 may use one or more etching steps to selectively remove the unprotected portions of the oxide layer 96, trench liner layer 95, and insulator layer 80, including a dry etching process such as reactive-ion etching, ion beam etching, plasma etching or laser etching, a wet etching process wherein a chemical etchant is employed or any combination thereof. As illustrated, the opening 100 is used to define and differentiate active regions for first and second types of MOS devices subsequently formed on the wafer structure 15, while the opening 102 is used to define a well tie region for selected MOS devices subsequently formed on the wafer structure 15. For example, the unetched portions of the second semiconductor layer 90 define a first device region for a first type of MOS device (e.g., NMOS devices), while the portions of the first semiconductor layer 70 that are exposed by the opening 100 (and subsequently epitaxially regrown, as described hereinbelow) define a second device region for a second type of MOS device (e.g., PMOS devices). To this end, the unetched portions of the oxide layer 96 and first trench liner 95 may be used to form at least part of the shallow trench isolation regions for electrically and physically isolating the first and second device regions from one another by designing the width and placement of the second etch openings 100, 102 to be wholly contained within the first etch opening 93.

At this stage of manufacture, well-regions (not shown) may be formed in the exposed portions of the first semiconductor layer 70 by selectively implanting dopants using the upper nitride layer 98 as an implant mask. For example, well regions may be formed by implanting impurities (e.g., arsenic or phosphorous or boron) with an implant energy of approximately 10-1000 keV and a dosage of approximately $1\times10^{11}$ to $1\times10^{14}$ cm$^{-2}$, though other implant species, energies, and dosages may be used.

Figure 6:
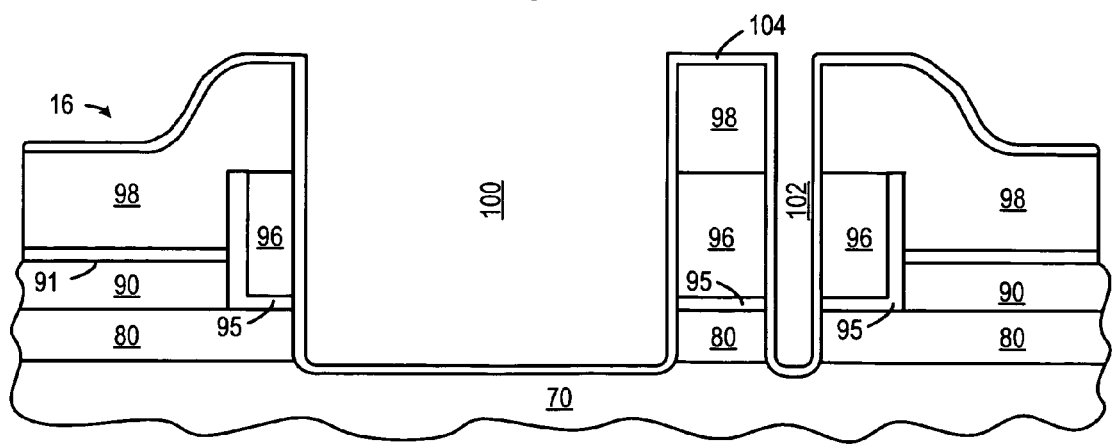
FIG. 6 illustrates processing subsequent to FIG. 5 after a second trench liner layer is deposited.

FIG. 6 illustrates processing of a semiconductor wafer structure 16 subsequent to FIG. 5 after a second trench liner layer 104 is deposited conformally over the wafer structure. In a selected embodiment, the second trench liner layer 104 may be deposited and/or grown as a conformal oxide and/or nitride layer in at least the openings 100, 102 to a thickness of approximately between 10-200 Angstroms, though other dielectric materials and thicknesses could be used.

Figure 7:
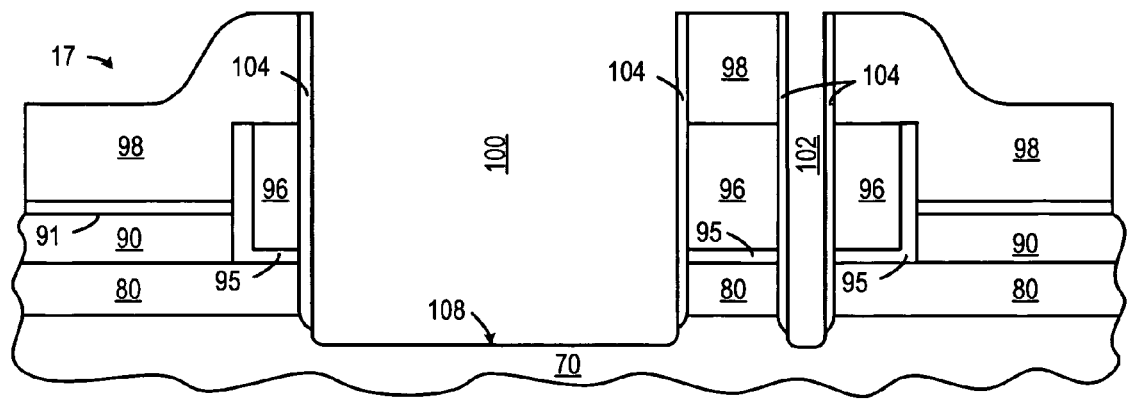
FIG. 7 illustrates processing subsequent to FIG. 6 after the second trench liner layer is anisotropically etched to expose at least the semiconductor substrate openings.

After depositing the second trench liner layer 104, an anisotropic etch step is performed to selectively remove the second trench liner layer 104 from the horizontal surfaces of the semiconductor wafer structure 17, as depicted in FIG. 7 which illustrates processing subsequent to FIG. 6. While any desired etch process may be used, in a selected embodiment, an anisotropic etch is used that includes a $CF_4$ and/or $SF_6$ and/or $CHF_3$ chemistries and an HF clean step to clear the substrate region 70 prior to epitaxial growth. As a result of the anisotropic etch step, the second trench liner layer 104 remains on the vertical surfaces and is removed from the horizontal surfaces, thereby exposing the semiconductor substrate 70 at the bottom 108 of the openings 100, 102. By forming the mask layer 98 and second trench liner layer 104 with nitride, a HF clean chemistry that is selective to nitride may be used to prepare the exposed semiconductor 70 at the bottom of the trench 108 for epitaxial growth.

Figure 8:
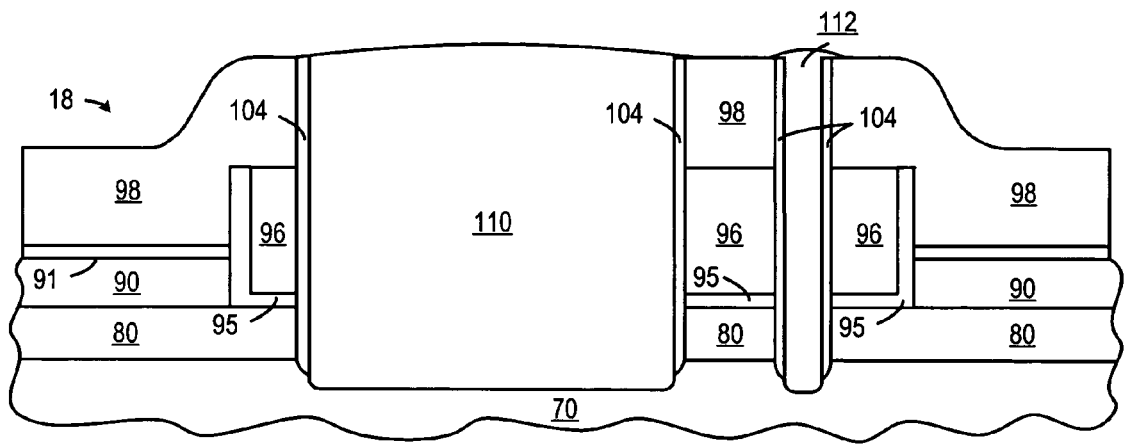
FIG. 8 illustrates processing subsequent to FIG. 7 after an epitaxial silicon layer is selectively formed to partially or completely fill the openings.

Turning now to FIG. 8, processing of a semiconductor wafer structure 18 subsequent to FIG. 7 is illustrated to show formation of selective epitaxial silicon layers 110, 112 to partially or completely fill the openings 100, 102 so that they are higher than the second semiconductor layer 90 and/or the mask layers 98. As described herein and understood by those skilled in the art, the process of forming an epitaxial layer may be described as either depositing or growing a layer so that the "growth" and "deposition" terms are used interchangeably in this respect, though growth is a more descriptive term for epitaxy. By selectively forming the semiconductor layers 110 and 112 so that their crystallographic orientation is different from or the same as the crystallographic orientation of the second semiconductor layer 90. If their orientation is different from semiconductor 90, then the mobility of the holes and electrons for subsequently formed PMOS and NMOS devices, respectively, may be optimized. Since the re-grown semiconductor layers 110 and 112 are epitaxially grown from the first semiconductor layer 70, they will have the same crystallographic orientations, though the layer 70, 110 and 112 can be formed of different semiconductor materials. Depending on the type of transistor device being fabricated, the semiconductor layer 110 may be formed from any semiconductor material, such as Si, SiGe, SiC, SiGeC or combinations thereof, which is capable of being formed utilizing a selective epitaxial growth method. Selected embodiments of the present invention also contemplate using strained or compressed materials to further enhance mobility. For example, if PMOS devices are formed over the semiconductor layer 110, the semiconductor layer 110 may be formed by epitaxially growing silicon having a crystallographic orientation (e.g., (110)) that is the same as the crystallographic orientation of the first semiconductor layer 70. This epitaxial growth may be achieved by heating the semiconductor wafer structure 18 at a temperature between 500 and 900° C. in the presence of dichlorosilane, HCl and hydrogen gas. Alternatively, if NMOS devices are formed over the semiconductor layer 110, at least a portion of the epitaxially grown layer 110 may be formed by epitaxially growing silicon having a (100) crystallographic orientation. In this case, the second semiconductor layer 90 would have a (110) crystallographic orientation, and the PMOS device would be built on this layer. By optimizing the crystallographic orientations of the layers 70, 110 (e.g., so that the epitaxially grown layer 110, or "epi-layer," is formed of (110) semiconductor material and the second semiconductor layer 90 is formed of (100) semiconductor material), significant mobility improvements are obtained over single-orientation substrates—up to 2.5× improvement for hole mobility in PMOS devices in (110) surface orientation silicon over those in (100) surface orientation silicon. In addition, by completely filling the trench opening 100 with an epitaxial semiconductor layer 110 that grows above and over the nitride mask layer 98, crystalline defectivity in the trench opening 100 is reduced or minimized. It will be appreciated that, when the epi layer 110 is formed with n-type material, the second semiconductor layer 90 in the SOI region may be formed of depositing strained p-type semiconductor material having a second crystal orientation that is different from the first crystal orientation. In a selected embodiment, semiconductor layers initially have only a small dopant concentration. Their dopant concentrations and types are established later with well, layers 110 and 112, and body, layer 90, implants.

Figure 9:
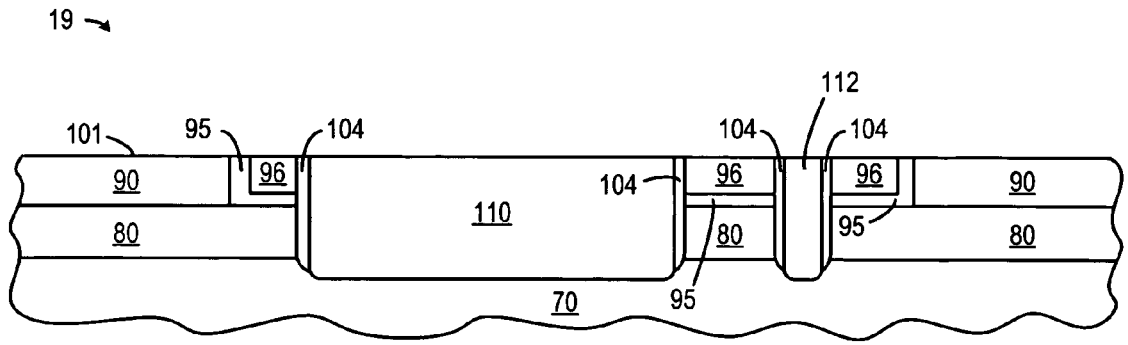
FIG. 9 illustrates processing subsequent to FIG. 8 after CMP polishing of the wafer structure and removal of the second nitride layer and first oxide layer.

FIG. 9 illustrates processing of a semiconductor wafer structure 19 subsequent to FIG. 8 after polishing of the wafer structure and removal of the second nitride layer 98 and first oxide layer 91. Chemical mechanical polishing and/or any desired etchant or stripping process may be used to planarize the epi silicon layers 110, 112, SOI semiconductor layer 90, nitride layer 98, first trench liner layer 95, oxide layer 96, second trench liner 104, and first oxide layer 91, including dry etching, wet etching or oxidation of silicon and then stripping away the layer(s). As a result, a dual substrate structure having a substantially coplanar surface 101 is obtained by polishing and/or etching the epi semiconductor layers 110, 112 back to the same level as the second semiconductor layer 90 and removing the layers of oxide 91 and nitride 98. Of course, the epi semiconductor layers 110, 112 may be polished or etched back to a lesser or greater extent, but in any case is substantially coplanar with the second semiconductor layer 90 to facilitate CMOS processing.

Figure 10:
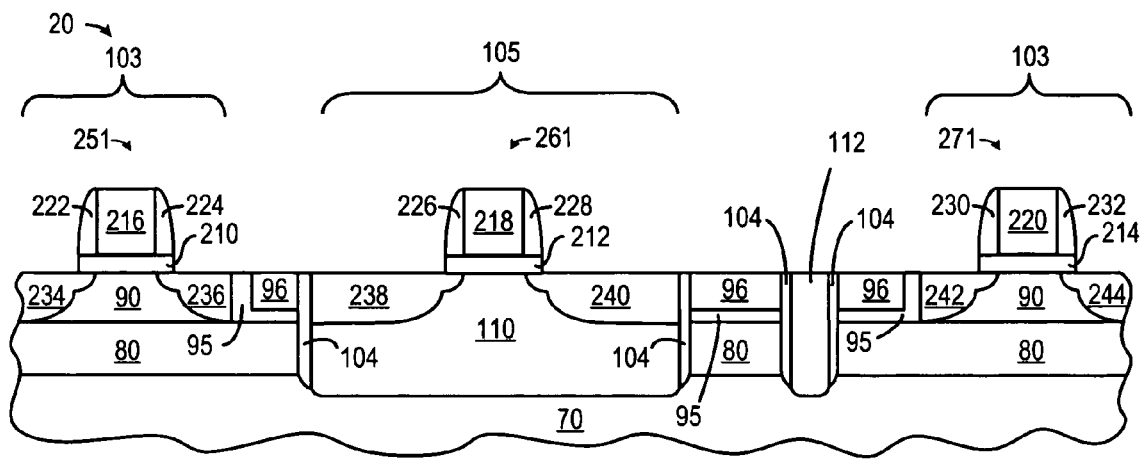
FIG. 10 illustrates processing subsequent to FIG. 9 in which first and second gate electrodes are partially formed.

FIG. 10 illustrates processing of a semiconductor wafer structure 20 subsequent to FIG. 9 in which, after well and body implants described herein below, first and second gate electrodes are formed with one or more gate dielectric layers to provide a high performance CMOS device. While other device structures may be used in connection with the planarized dual substrate wafer described herein, the example of FIG. 10 depicts a device structure formed from a gate dielectric material (such as silicon dioxide) and gate structures (such as polysilicon gates). In the implementation depicted in FIG. 10, PMOS and NMOS devices may be formed on the exposed semiconductor layers (i.e., second semiconductor layer 90 and epi semiconductor layer 110), which may include well and body regions (not shown) in each layer 110, 90, respectively. Specifically, a first semiconductor device 251, 271 is an NMOS device formed on a portion of the second conductive layer 90 in the SOI region, and a second semiconductor device 261 is a PMOS device formed on a portion of the second epi semiconductor layer 110. Alternatively, the first semiconductor device 251, 271 may be a PMOS device and the second semiconductor device 261 may be an NMOS device. The allocation of device types to device regions may exploit the differing crystal orientation of the underlying layers 110, 90 to provide a high performance CMOS device where the PMOS device has improved hole mobility. This may be accomplished, for example, by forming the PMOS devices over the semiconductor material that has a (110) or (111) orientation, whereas the NMOS devices are formed over a semiconductor surface having a (100) orientation. In addition, the hole mobility of the PMOS devices may be further improved by forming the PMOS gate dielectrics and electrodes over a layer of compressed silicon germanium having a (110) orientation. The electron mobility of the NMOS devices may be further improved by forming the NMOS gate dielectrics and electrodes over a layer of tensile silicon having a (100) orientation.

In the semiconductor wafer structure 20 depicted in FIG. 10, the depicted wafer structure 20 includes a first SOI semiconductor layer 90—in which may be formed a body region (not shown)—and a second epi-layer 110—in which may be formed a well region (not shown)—that are laterally displaced and isolated with respect to one another by shallow trench isolation region 96, liners 95 and 104, and isolation layer 80. The body and well regions contain impurities such that one is a p-doped and one is an n-doped. In the described embodiment, the body in the SOI layer 90 is a p-doped in which NMOS transistors are formed, and the well in the epi-layer 110 is an n-doped in which PMOS transistors are formed.

Following the formation of wells and isolation trenches, at least a first gate dielectric layer is blanket deposited across the entire wafer structure 20 and used to subsequently form the gate dielectric layers 210, 212, 214. The first gate dielectric layer may be used to form at least part of the gate dielectric for all transistors on the wafer, or alternatively, the first gate dielectric layer may be used for only a first type of transistor formed on the wafer. In the depicted embodiment, the first gate dielectric layer may formed from a dielectric (e.g., silicon dioxide or a metal oxide) that is formed by oxidation, chemical vapor deposition, or by atomic layer deposition having a typical final thickness that is in the range of 0.1-10 nanometers.

After forming the first gate dielectric layer, one or more first gate electrodes 216, 218, 220 are formed on the first gate dielectric layer above first SOI semiconductor layer 90 and second epi layer 110 using any desired gate electrode formation sequence. For example, the gate electrodes 216, 218, 220 may be formed from at least a first conductive layer (e.g., polysilicon, SiGe and/or metal) by depositing or forming a first conductive layer having a thickness in the range of 1-200 nanometers over the gate dielectric layer to form a first gate stack. Once the first gate stack is formed, any desired gate electrode etch processing steps may be used to form the desired gate electrode 216, 218, 220 over the first gate dielectric layer.

With the etched gate electrodes 216, 218, 220 in place, one or more sidewall spacers 222/224, 226/228, 230/232 may be formed on the sides of the gate electrodes 216, 218, 220 by depositing a spacer layer over the wafer structure 20 and then anisotropically etching the spacer layer and exposed first gate dielectric layer down to the substrate 90, 110. With the spacers in place, source/drain regions may be formed in the substrates 90, 110 using any desired implantation sequence. For example, the gate electrodes 216, 220 in the first active device region 103 may be masked so that the source/drain regions 238, 240 in the second active device region 105 may be formed by implanting dopants into the exposed regions of the substrate 110. As will be appreciated, the dopants may be implanted into source/drain regions 238, 240 around the gate electrode 218 prior to forming sidewall spacers 226, 228 and/or after forming sidewall spacers 226, 228. In similar fashion, the gate electrodes 218 in the second active device region 105 may be masked so that the source/drain regions 234/236, 242/244 in the first active device region 103 may be formed by implanting dopants into the exposed regions of the substrate 90, again by implanting dopants around the gate electrodes 216, 220 and/or by first forming sidewall spacers 222/224, 230/232 on the sides of the gate electrodes 216, 220 and then implanting the source/drain regions 234/236, 242/244.

As a result of the foregoing steps, isolations regions are formed from the unetched oxide layer 96, trench liner layers 95 and 104, and isolation layer 80, which serve to provide electrical and physical isolation between transistor devices in the first semiconductor active device region 103 and transistor devices in the second semiconductor active device region 105. This is illustrated in FIG. 10 by the STI isolation oxide region 96 which is protected from the SOI semiconductor layer 90 by the first trench oxide liner 95, and which is protected from the epi semiconductor layer 110 by the second trench oxide liner 104. By forming the STI regions with an early trench liner layer 95, and then subsequently forming a late trench liner layer 104 during formation of the epi semiconductor layers 110 and 112, the performance and process limits associated with forming the STI regions last are avoided. However, it will be appreciated the trench liner layers may be formed with other processing sequences, so long as both sides of the STI regions include a trench liner layer in the finally formed structure to provide at least lateral electrical isolation between the epi semiconductor layer and SOI semiconductor layer.

Figure 11:
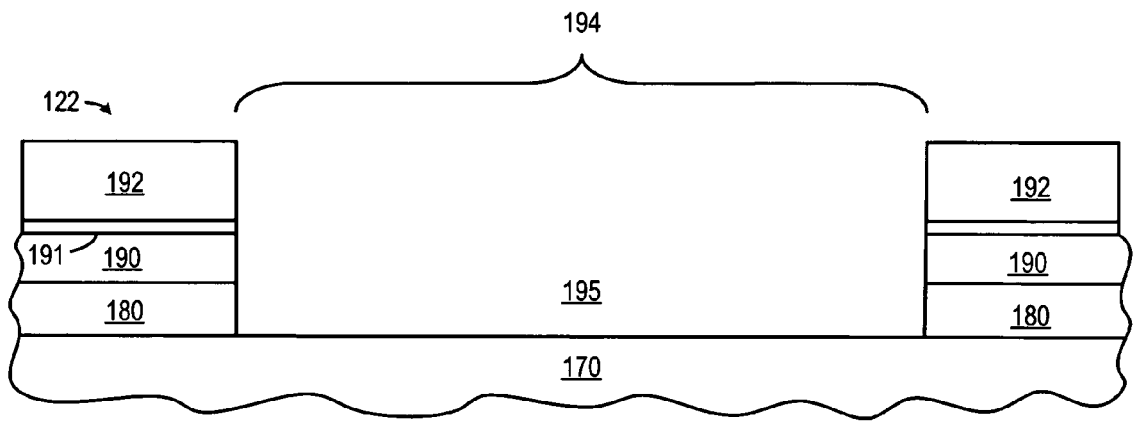
FIG. 11 is a partial cross-sectional view of a semiconductor structure in accordance with selected alternative embodiments of the present invention where an oxide layer and SOI layers are selectively etched using an etch mask to form a shallow trench to expose a portion of an underlying semiconductor substrate.

For example, FIG. 11 illustrates a partial cross-sectional view of a semiconductor structure 122 in accordance with other embodiments of the present invention whereby the first trench liner layer is formed all the way down to the first semiconductor substrate layer 170. As depicted, a patterned and etched nitride layer 192 is used as a mask to etch a first oxide layer 191, SOI semiconductor layer 190 and SOI insulator layer 180 to form a shallow trench 195 through the buried oxide layer 180 to expose a portion of an underlying semiconductor substrate 170.

Figure 12:
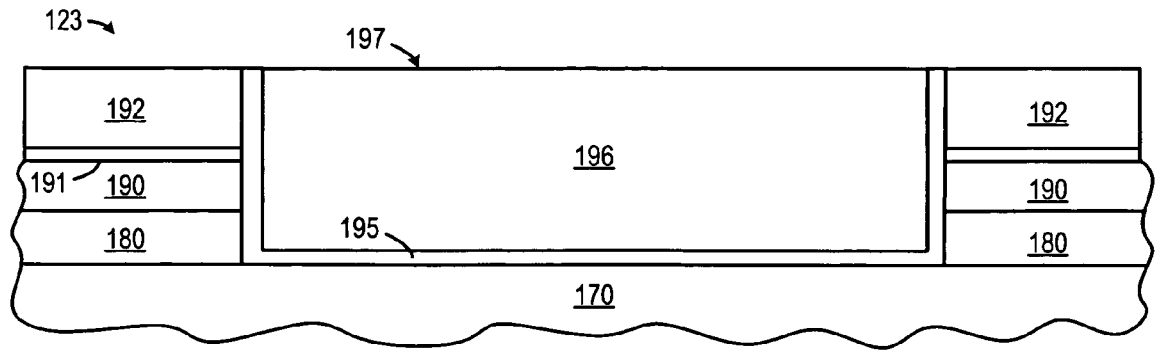
FIG. 12 illustrates processing subsequent to FIG. 11 after a first trench liner layer and deposited oxide layer are formed in a shallow trench and planarized to form a shallow trench region.

FIG. 12 illustrates processing of a semiconductor structure 123 subsequent to FIG. 11 after a first trench liner layer 195 and deposited oxide layer 196 are formed in the shallow trench 194 and planarized to form a shallow trench region 197. Though any desired dielectric materials and thicknesses could be used, in a selected embodiment, the first trench liner layer 195 may be deposited and/or grown as a conformal oxide and/or nitride layer in at least the shallow trench 194 to a thickness of approximately between 10-200 Angstroms, followed by deposition of a high density plasma oxide layer 196 and then a planarization step to CMP the layers 195 and 196 back to level with the mask layer 192 (as shown in FIG. 12) or back to the level of the second semiconductor layer 190 (not shown).

Figure 13:
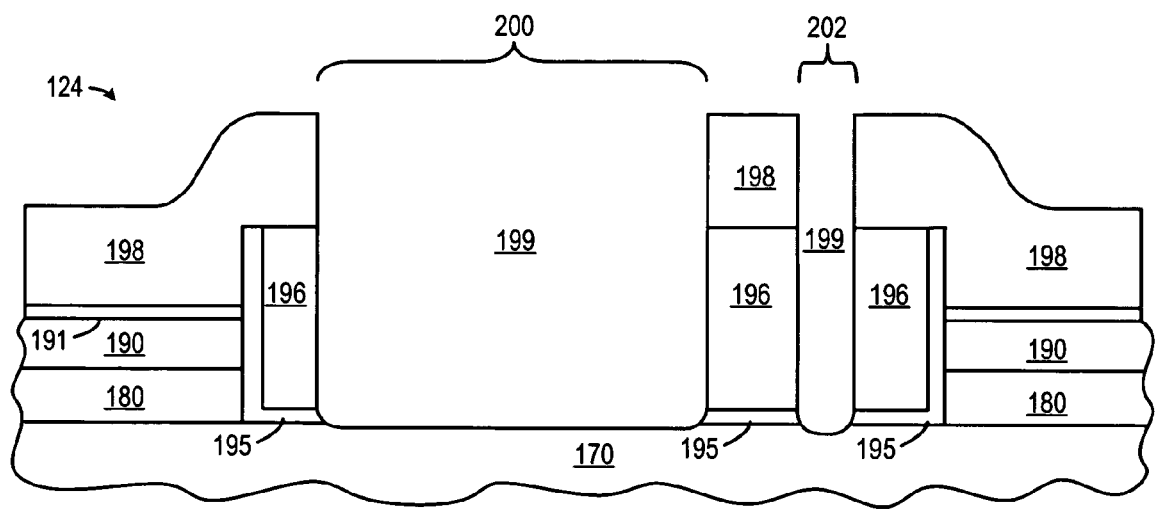
FIG. 13 illustrates processing subsequent to FIG. 12 after a second nitride layer is formed over at least the shallow trench region and portions of the second nitride layer, deposited oxide layer, and first trench liner layer have been removed to form one or more openings to the semiconductor substrate.

FIG. 13 illustrates processing of a semiconductor structure 124 subsequent to FIG. 12 after the mask layer 192 was removed, and a second nitride layer 198 is formed as a mask having one or more openings 200, 202 over at least part of the shallow trench region 195, 196. With the mask 198 in place, exposed portions of the deposited oxide layer 196 and first trench liner layer 195 are removed using one or more pattern and etching steps to form one or more openings 199 to the semiconductor substrate. The openings 199 are used to define and differentiate active regions for first and second types of MOS devices subsequently formed on the semiconductor structure 124, and/or to define a well tie region for selected MOS devices subsequently formed on the semiconductor structure 124. For example, the unetched portions of the second semiconductor layer 190 define a first device region for a first type of MOS device (e.g., NMOS devices), while the portions of the first semiconductor layer 170 that are exposed by the opening 199 (and subsequently epitaxially re-grown) define a second device region for a second type of MOS device (e.g., PMOS devices). To this end, the unetched portions of the oxide layer 196 and first trench liner 195 may be used to form at least part of the shallow trench isolation regions for electrically and physically isolating the first and second device regions from one another. Well regions (not shown) may optionally be formed at this stage of manufacture in the exposed portions of the first semiconductor layer 170 by selectively implanting dopants using the upper nitride layer 198 as an implant mask. For example, well regions may be formed by implanting impurities (e.g., arsenic or phosphorous or boron) with an implant energy of approximately 10-1000 keV and a dosage of approximately $1\times10^{11}$ to $1\times10^{14}$ cm$^{-2}$, though other implant species, energies, and dosages may be used.

Figure 14:
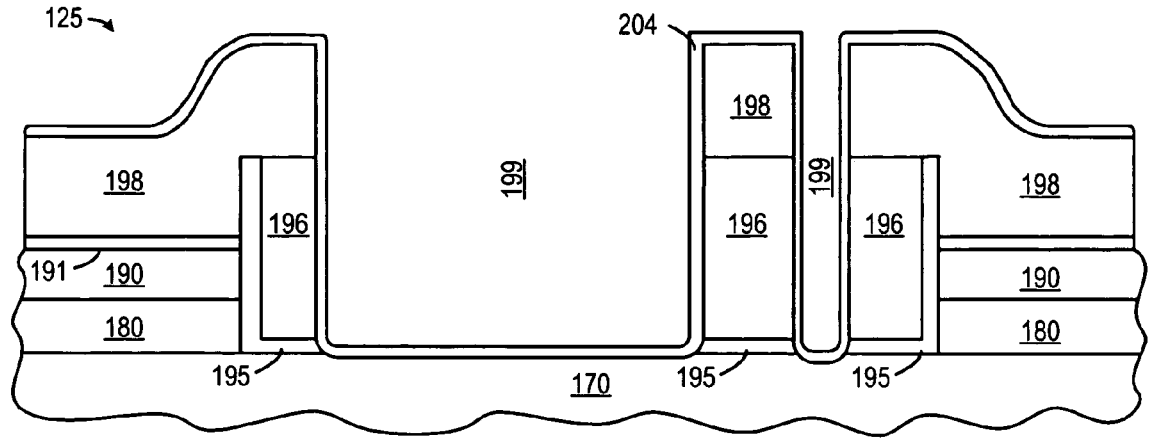
FIG. 14 illustrates processing subsequent to FIG. 13 after a second trench liner layer is deposited.
Figure 15:
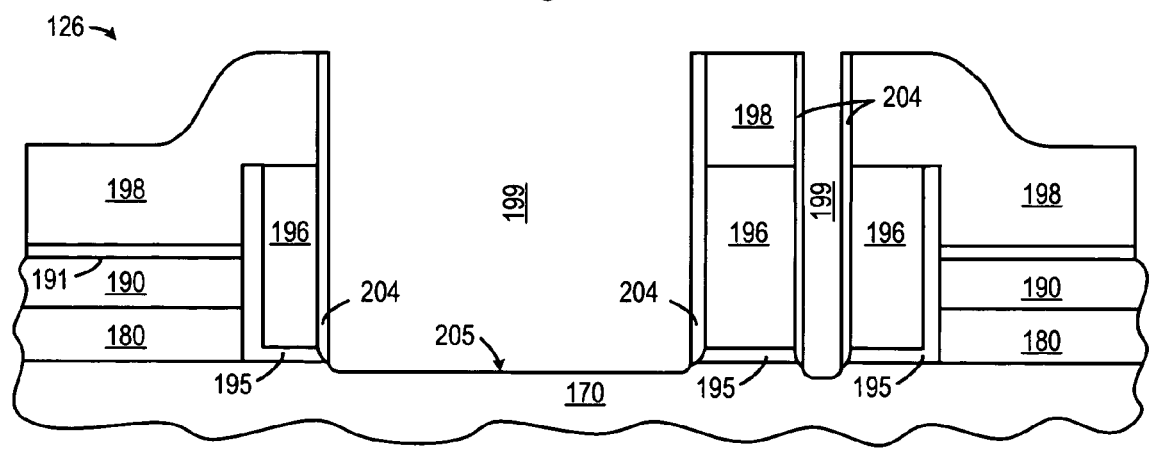
FIG. 15 illustrates processing subsequent to FIG. 14 after the second trench liner layer is anisotropically etched to expose at least the semiconductor substrate openings.

FIG. 14 illustrates processing of a semiconductor structure 125 subsequent to FIG. 13 after a second trench liner layer 204 is deposited conformally over the semiconductor structure. In a selected embodiment, the second trench liner layer 204 may be deposited and/or grown as a conformal oxide and/or nitride layer in at least the opening 199 to a thickness of approximately between 10-200 Angstroms, though other dielectric materials and thicknesses could be used. The second trench liner layer 204 is then anisotropically etched to selectively remove the second trench liner layer 204 from the horizontal surfaces of the semiconductor structure 126, as depicted in FIG. 15 which illustrates processing subsequent to FIG. 14. While any desired etch process may be used, in a selected embodiment, an anistropic etch is used that includes $CF_4$ and/or $SF_6$, and/or $CHF_3$ chemistries and an HF clean step to clear the substrate region 170 prior to epitaxial growth. As a result of the anisotropic etch step, the second trench liner layer 204 remains on the vertical surfaces and is removed from the horizontal surfaces 205, thereby exposing the semiconductor substrate 170 at the bottom of the openings 199.

Figure 16:
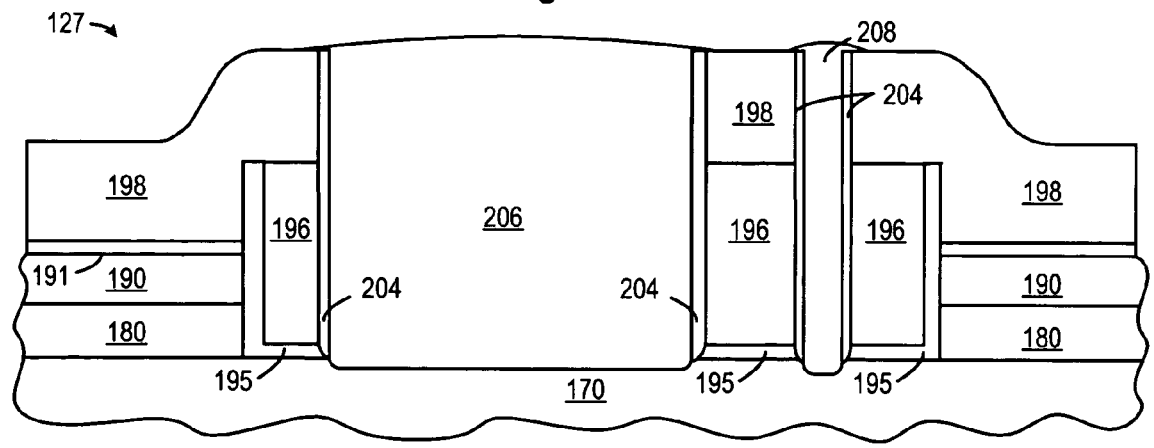
FIG. 16 illustrates processing subsequent to FIG. 15 after an epitaxial silicon layer is selectively formed to partially or completely fill the openings.

Turning now to FIG. 16, processing of a semiconductor structure 127 subsequent to FIG. 15 is illustrated to show formation of selective epitaxial silicon layers 206, 208 to partially or completely fill the openings 199 so that they are higher than the second semiconductor layer 190 and/or the mask layers 198. By selectively forming the semiconductor layer 206 as described hereinabove so that its crystallographic orientation is different from the crystallographic orientation of the second semiconductor layer 190, the mobility of the holes and electrons for subsequently formed PMOS and NMOS devices, respectively, may be optimized. As a result, subsequent polishing, etching and/or stripping of the semiconductor structure 127 may be used to planarize the epi silicon layers 206, 208, SOI semiconductor layer 190, nitride layer 198, first trench liner layer 195, oxide layer 196, second trench liner 204, and first oxide layer 191, including dry etching, wet etching or oxidation of silicon and then stripping away the layer(s). As a result, a dual substrate structure having a substantially coplanar surface may be obtained by polishing and/or etching the epi semiconductor layers 206, 208 back so that they are substantially coplanar with the second semiconductor layer 190 to facilitate CMOS processing. A cross-sectional view of such a planarized dual substrate structure would look very similar to the illustration of FIG. 9, except that the first trench liner 195 and deposited oxide 196 of the shallow trench isolation regions extend through the SOI insulator layer 180 and down to the first semiconductor substrate layer 170. With additional CMOS processing, first and second metal gate electrodes could be formed (substantially as depicted in FIG. 10), though such advanced gate features are not required, and the planarized dual substrate wafer could also be integrated with other gate dielectric materials (such as silicon dioxide) and gate structures (such as polysilicon gates).

Figure 17:
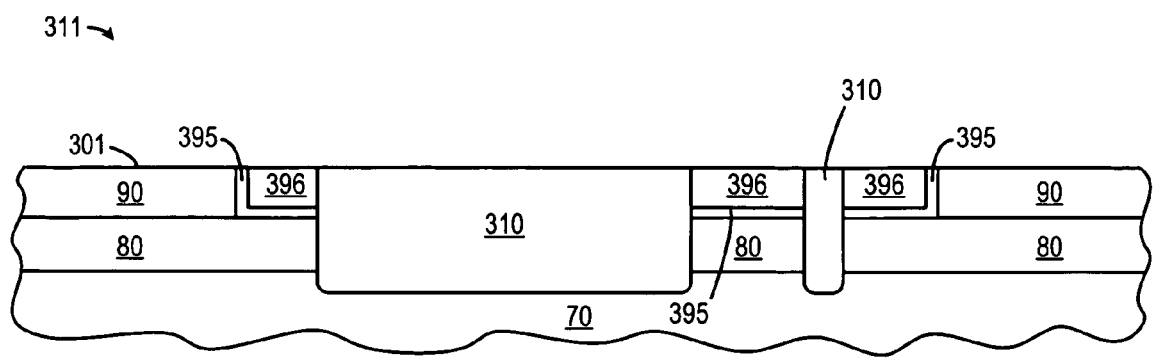
FIG. 17 is a partial cross-sectional view of a semiconductor structure in accordance with other alternative embodiments of the present invention where a polished epitaxial silicon layer is formed after a first trench liner layer but before a second trench liner layer.

In accordance with yet other embodiments of the present invention, the second trench liner layer may be formed after forming the epitaxial semiconductor layer by using an oxidation process to grow oxide at the oxide-semiconductor interfaces around the shallow trench isolation regions. An example implementation is illustrated in FIG. 17 which depicts a partial cross-sectional view of a semiconductor structure 311 having a semiconductor substrate layer 70 on which are formed semiconductor-on-insulator (SOI) layers 80, 90. In the SOI semiconductor layer 90, a shallow trench isolation region 396 and first trench liner layer 395 are formed, substantially as described with reference to FIGS. 1-3 (though it will be appreciated that deeper isolation regions may be formed, such as depicted in FIGS. 11-12). Thereafter, a polished epitaxial semiconductor layer 310 is formed by etching one or more openings to expose the semiconductor substrate layer 70, epitaxially growing the epitaxial semiconductor layers 310 from the semiconductor substrate layer 70, and then polishing the semiconductor structure 311 to a substantially planar surface 301. At this point in the depicted process (shown in FIG. 17), the second trench liner layer has not yet been formed.

Figure 18:
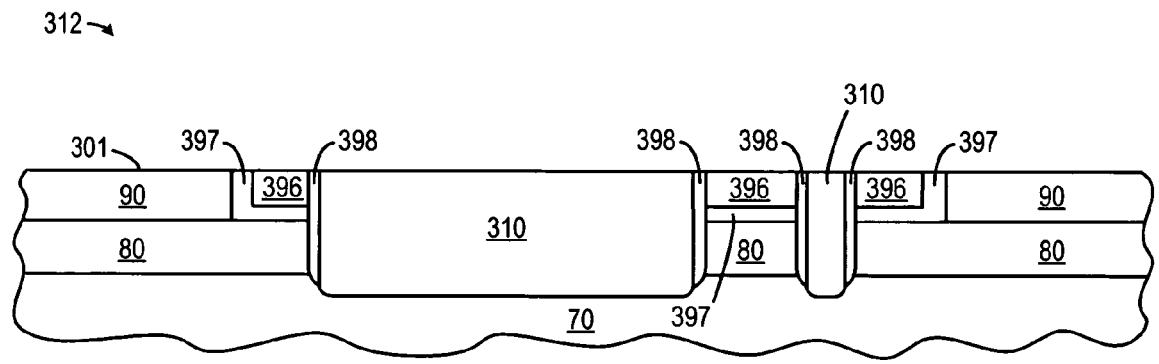
FIG. 18 illustrates processing subsequent to FIG. 17 after a second trench liner layer is formed.

FIG. 18 illustrates processing of a semiconductor structure 312 subsequent to FIG. 17 after a second trench liner layer 398 is formed using a combination of an oxidation process (such as a dry or wet thermal oxide growth process) and a polish or etch process to clear oxide from the top surfaces of the structure. As depicted, the oxidation process grows a second trench liner layer 398 at the oxide-semiconductor interfaces around the shallow trench isolation regions 396, while at the same time thickening the first trench liner layers 397. In an example implementation, the second trench liner layer 398 may be formed with a wet or dry thermal oxidation process at a predetermined temperature (e.g., 750-1200° C.) to obtain the desired thickness at the sidewall interface (e.g., between 20 and 500 Angstroms), though the conditions, timing and temperature of the oxidation process can vary from these examples, depending on the desired thickness and application. For example, the second trench liner layer 398 may be thinner with logic applications, and may be thicker with memory applications. During the oxidation process, oxygen molecules are able to penetrate the oxide layers (such as isolation regions 396 and buried oxide layer 80) to combine with the semiconductor molecules from the epitaxial semiconductor layer 310 and the SOI semiconductor layer 90. As a result of the foregoing steps, isolations regions 396 are formed which serve to provide electrical and physical isolation between transistor devices formed on the epitaxial semiconductor layer 310 and on the SOI semiconductor layer 90. As illustrated in FIG. 18, the STI isolation oxide region 396 is protected from the SOI semiconductor layer 90 by the first trench oxide liner 397, and is protected from the epi semiconductor layer 310 by the second trench oxide liner 398. When the second trench liner layer 398 is formed after forming the early trench liner layer 395 and the epitaxial semiconductor layer 310, the relative thicknesses of the early trench liner layer 395 and final trench liner layers 397, 398 may be optimized and tuned as needed. An advantage of the embodiments illustrated in FIGS. 17-18 is that the second trench liner layer may be formed without requiring a conformal deposition and anisotropic etch sequence (such as depicted in FIGS. 6-7 and 14-15). In addition, the respective thicknesses of the first and second trench liner layers may be carefully controlled by using a thermal oxide growth process that takes into account the different oxidation rates of the SOI semiconductor layer 90 and the epitaxial semiconductor layer 310.

It will be appreciated that additional processing steps will be used to complete the fabrication of first and second gate electrodes into transistors. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

In one form, there is provided herein a method for fabricating a dual substrate semiconductor structure by forming a first semiconductor layer having a first crystal orientation, and then forming over the first semiconductor layer a second semiconductor layer (e.g., (100) p-type silicon) that is electrically isolated from the first semiconductor layer (e.g., by a buried oxide layer) and that has a second, different crystal orientation. Alternatively, the first semiconductor layer and the second semiconductor layer have the same crystal orientation. A first trench is then formed by selectively removing a portion of the second semiconductor layer in a first predetermined region, though the buried oxide layer may also be removed during formation of the first trench. After the first trench is formed, a first trench liner (e.g., a conformal layer of nitride) and first oxide layer are sequentially deposited in the first trench and then polished down to an underlying polish stop layer. Within the first predetermined region, a second trench is formed to expose the first semiconductor layer without exposing the second semiconductor layer. The second trench may be formed by selectively removing a portion of the first oxide layer, the first trench liner, and the buried oxide layer in a second predetermined region contained within the first predetermined region. Next, a second trench liner (e.g., a conformal layer of nitride) is deposited in the second trench, and then anisotropically etched to expose the first semiconductor layer while leaving a portion of the second trench liner on vertical sidewalls of the second trench. All or part of the second trench may then be filled by epitaxially growing a third semiconductor layer that is electrically isolated from the second semiconductor layer and that has a third crystal orientation that is the same as the first crystal orientation. A chemical mechanical polish step is then performed so that the second semiconductor layer is substantially coplanar with the third semiconductor layer. Either or both of the trenches may be formed by forming a mask over the layer(s) to be etched having an opening over a predetermined region, and then using the mask to form the trench. As a result of the sequence, the second semiconductor layer is electrically isolated from the third semiconductor layer by a shallow trench isolation region formed from the first trench liner, first oxide layer and second trench liner located between the second semiconductor layer and the third semiconductor layer. Thus, regardless of how deeply the first trench is formed, the first trench liner and second trench liner surround the first oxide layer on the bottom and sides. After polishing and/or etching the third semiconductor layer so that it is substantially coplanar with the second semiconductor layer, a first gate stack structure (including a first gate dielectric layer and a first conductive layer) may be formed over the third semiconductor silicon layer, while a second gate stack structure (including a second gate dielectric layer and a second conductive layer) may be formed over the second semiconductor layer. The first and second gate dielectrics may be the same or may different in thickness, composition, and/or structure. The first and second conductive layers may be the same or may different in thickness, composition, and/or structure.

In another form, there is provided a method for forming a semiconductor structure having dual substrates on a wafer. Under the method, first and second semiconductor layers are formed, where the second semiconductor layer is formed over the first semiconductor layer and is electrically isolated therefrom by a buried insulator layer. After a first trench opening is formed by removing the second semiconductor layer (and possibly also the buried insulator layer) in a first region, a first trench liner layer, such as a conformal layer of oxide and/or nitride, is formed in the first trench opening to cover the bottom and side surfaces of the first trench opening, and then the remainder of the first trench opening is filled with an insulator region. Subsequently, a second trench opening is formed by removing the insulator region and the first trench liner layer in a second region that is contained within the first region (thereby exposing the first semiconductor layer in the second region). A second trench liner layer is then formed to cover at least a side surface of the second trench opening, such as by conformally depositing the second trench liner layer and then anisotropically etching the second trench liner layer to selectively remove the second trench liner layer from horizontal surfaces of the second trench opening, thereby exposing the first semiconductor layer in the second region. Subsequently, the second trench opening is at least partially filled by epitaxially growing a first epitaxial semiconductor layer from an exposed surface of the first semiconductor layer. By performing a chemical mechanical polish step on the resulting structure, the first epitaxial semiconductor layer, the second semiconductor layer and any exposed portions of the insulator region and trench liner layers are polished and planarized. As a result of the CMP, the polished first epitaxial semiconductor layer forms a first substrate (e.g., (110) n-type silicon), and the polished second semiconductor layer forms a second substrate (e.g., (100) p-type silicon). Another result of the CMP is that the planarized exposed portions of the insulator region and trench liner layers form a shallow trench isolation region that isolates the first substrate from the second substrate. The resulting shallow trench isolation region includes an interior region (formed from the insulator region), a first sidewall region (formed from part of the first trench liner layer and positioned between the interior region and the second semiconductor layer) and a second sidewall region (formed from part of the second trench liner layer and positioned between the interior region and the first epitaxial semiconductor layer).

In yet another form, an apparatus and manufacturing method are disclosed for fabricating a semiconductor structure having first and second substrates that are electrically isolated from one another by a shallow trench isolation region. As described, the shallow trench isolation region includes a first liner formed on a bottom and a first side surface of the shallow trench isolation region after formation of the first substrate but before formation of the second substrate. In addition, the shallow trench isolation region includes an interior insulation region formed over the first liner layer after formation of the first liner. Also, the shallow trench isolation region includes a second liner formed on a second side surface of the shallow trench isolation region after formation of the interior insulation region but before formation of the second substrate. As a result, the first and second liners completely encapsulate the interior insulation region of the shallow trench isolation region.

In another form, there is provided a method for fabricating a dual substrate semiconductor structure by forming first and second semiconductor layers having different crystal orientations so that the second semiconductor layer is formed over the first semiconductor layer and is electrically isolated therefrom by a buried insulator layer. After forming a first trench by selectively removing a portion of the second semiconductor layer in a first predetermined region, a first trench liner layer and first insulator layer are sequentially deposited in the trench and then polished down to an underlying polish stop layer. Subsequently, a second trench is formed to expose the first semiconductor layer by selectively removing a portion of the first insulator layer, first trench liner, and buried insulator layer in a second predetermined region contained within the first predetermined region. The second trench is at least partially filled with a first epitaxial semiconductor layer that is electrically isolated from the second semiconductor layer by, for example, epitaxially growing a semiconductor material on an exposed surface of the first semiconductor layer and planarizing first epitaxial semiconductor layer and second semiconductor layer. The resulting structure is then subjected to an oxidation step to grow a second trench liner at any side surface interface between the first epitaxial semiconductor layer and the first insulator layer. In addition, a chemical mechanical polish step may then be used to planarize the first epitaxial semiconductor layer, the second semiconductor layer and any exposed portions of the insulator region and trench liner layers.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 10 is for first well (not shown) in the layer 90 to be an n-doped well and the second well (not shown) in the layer 110 to be p-doped. Also the first gate layers (212, 232) and the second conductive layers (214, 234) may be different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed semiconductor manufacturing processes provide the full trench liner benefits in a Dual-Substrate Orientation (DSO) integration while reducing or eliminating the process and performance limitations associated with forming the shallow trench isolations regions after forming the hybrid substrates. In selected embodiments, a two-stage trench liner formation process provides liner benefits to a DSO substrate device, such as STI sidewall passivation, etch damage cure, corner rounding and/or divot prevention. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for fabricating a dual substrate semiconductor structure, comprising:

forming a first semiconductor layer having a first crystal orientation;

forming a second semiconductor layer over at least part of the first semiconductor layer, wherein the second semiconductor layer is electrically isolated from the first semiconductor layer by a buried oxide layer and has a second crystal orientation that is different from the first crystal orientation;

forming a first trench by selectively removing a portion of the second semiconductor layer in a first predetermined region;

depositing a first trench liner in the first trench;

depositing a first oxide layer over the first trench liner;

polishing the first trench liner and first oxide layer down to an underlying polish stop layer;

forming a second trench to expose the first semiconductor layer without exposing the second semiconductor layer by selectively removing a portion of the first oxide layer, first trench liner, and buried oxide layer in a second predetermined region contained within the first predetermined region;

depositing a second trench liner in the second trench;

anisotropically etching the second trench liner to expose the first semiconductor layer while leaving a portion of the second trench liner on vertical sidewalls of the second trench; and filling at least part of the second trench with a third semiconductor layer that is electrically isolated from the second semiconductor layer and that has a third crystal orientation that is the same as the first crystal orientation by epitaxially growing silicon on an exposed surface of the first semiconductor layer.

2. The method of claim 1, further comprising performing a chemical mechanical polish step so that the second semiconductor layer is substantially coplanar with the third semiconductor layer.

3. The method of claim 1, where forming a first trench comprises:
   forming a first mask over the second semiconductor layer having an opening over a first predetermined region; and
   using the first mask to form the first trench.

4. The method of claim 1, where forming a second trench comprises:
   forming a second mask having an opening over the second predetermined region contained within the first predetermined region; and
   using the second mask to form the second trench that exposes the first semiconductor layer without exposing the second semiconductor layer.

5. The method of claim 1, wherein the second semiconductor layer comprises (100) p-type silicon and the third semiconductor layer comprises (110) n-type silicon.

6. The method of claim 1, where depositing a second trench liner comprises conformally depositing an oxide or nitride layer.

7. The method of claim 1, where the second semiconductor layer is electrically isolated from the third semiconductor layer by a shallow trench isolation region formed from the first trench liner, first oxide layer and second trench liner located between the second semiconductor layer and the third semiconductor layer.

8. The method of claim 1, further comprising:
   forming a first gate electrode structure over the third semiconductor layer; and
   forming a second gate electrode structure over the second semiconductor layer.

9. The method of claim 1, where forming a first trench comprises selectively removing a portion of the second semiconductor layer and the buried oxide layer in the first predetermined region.

10. The method of claim 1, where the first trench liner and second trench liner surround the first oxide layer on at least bottom and side surfaces of the first oxide layer after the second trench liner is deposited in the second trench.

11. A method for forming a semiconductor structure having dual substrates on a wafer, comprising:
   forming a first semiconductor layer;
   forming a second semiconductor layer over at least part of the first semiconductor layer, wherein the second semiconductor layer is electrically isolated from the first semiconductor layer by a buried insulator layer;
   forming a first trench opening by removing at least the second semiconductor layer in a first region;
   forming a first trench liner layer in the first trench opening to cover bottom and side surfaces of the first trench opening;
   forming an insulator region over the first trench liner layer in the first trench opening;
   forming a second trench opening by removing at least the insulator region and the first trench liner layer in a second region within the first region to expose the first semiconductor layer;
   forming a second trench liner layer in the second trench opening to cover at least a side surface of the second trench opening;
   filling at least part of a second trench opening that exposes the first semiconductor layer by epitaxially growing a first epitaxial semiconductor layer on at least an exposed surface of the first semiconductor layer; and
   performing a chemical mechanical polish step to planarize the first epitaxial semiconductor layer, the second semiconductor layer and any exposed portions of the insulator region and trench liner layers, whereby a polished first epitaxial semiconductor layer comprises a first substrate and a polished second semiconductor layer comprises a second substrate.

12. The method of claim 11, where forming a first trench opening comprises removing the second semiconductor layer and the buried insulator layer in the first region to expose the first semiconductor layer.

13. The method of claim 11, where forming a first trench opening comprises removing the second semiconductor layer in the first region to expose the buried insulator layer.

14. The method of claim 11, where forming a second trench liner layer in the second trench opening to cover at least a side surface of the second trench opening comprises:
   conformally depositing a second trench liner layer to cover bottom and side surfaces of the second trench opening; and
   anisotropically etching the second trench liner layer to selectively remove the second trench liner layer from horizontal surfaces of the second trench opening, thereby exposing the first semiconductor layer in the second region.

15. The method of claim 11, where the exposed portions of the insulator region and trench liner layers that have been planarized form a shallow trench isolation region that isolates the first substrate from the second substrate.

16. The method of claim 15, where the shallow trench isolation region comprises:
   an interior region formed from the insulator region, a first sidewall region formed from at least part of the first trench liner layer and positioned between the interior region and the second semiconductor layer; and a second sidewall region formed from at least part of the second trench liner layer and positioned between the interior region and the first epitaxial semiconductor layer.

17. The method of claim 11, where the first trench liner layer comprises a conformal layer of oxide or nitride.

18. The method of claim 11, where the second semiconductor layer comprises (100) p-type silicon and the first epitaxial semiconductor layer comprises (110) n-type silicon.

19. A method for fabricating a dual substrate semiconductor structure, comprising:

forming a first semiconductor layer;

forming a second semiconductor layer over at least part of the first semiconductor layer, wherein the second semiconductor layer is electrically isolated from the first semiconductor layer by a buried insulator layer;

forming a first trench by selectively removing a portion of the second semiconductor layer in a first predetermined region;

depositing a first trench liner in the first trench;

depositing a first insulator layer over the first trench liner;

polishing the first trench liner and first insulator layer down to an underlying polish stop layer;

forming a second trench to expose the first semiconductor layer by selectively removing a portion of the first insulator layer, first trench liner, and buried insulator layer in a second predetermined region contained within the first predetermined region;

filling at least part of the second trench with a first epitaxial semiconductor layer that is electrically isolated from the second semiconductor layer by epitaxially growing a semiconductor material on an exposed surface of the first semiconductor layer; and performing an oxidation step to grow a second trench liner at any side surface interface between the first epitaxial semiconductor layer and the first insulator layer.

20. The method of claim 19, further comprising planarizing the first epitaxial semiconductor layer, the second semiconductor layer and any exposed portions of the insulator region and first trench liner layer prior to performing the oxidation step.

21. The method of claim 19, further comprising performing a chemical mechanical polish step to planarize the first epitaxial semiconductor layer, the second semiconductor layer and any exposed portions of the insulator region and trench liner layers.

22. The method of claim 19, where the first semiconductor layer and second semiconductor layer have different crystal orientations.

* * * * *